United States Patent
Arai et al.

[11] Patent Number: 5,981,092
[45] Date of Patent: Nov. 9, 1999

[54] ORGANIC EL DEVICE

[75] Inventors: Michio Arai, Tokyo; Masami Mori; Kenji Nakaya, both of Chiba, all of Japan

[73] Assignee: TDK Corporation, Tokyo, Japan

[21] Appl. No.: 08/823,420

[22] Filed: Mar. 25, 1997

[30] Foreign Application Priority Data

Mar. 25, 1996 [JP] Japan ............................ 8-068139
Mar. 25, 1996 [JP] Japan ............................ 8-068140

[51] Int. Cl.$^6$ .......................................... H05B 33/13
[52] U.S. Cl. .................. 428/690; 428/691; 428/917; 313/504
[58] Field of Search .......................... 428/690, 917, 428/691; 313/504

[56] References Cited

U.S. PATENT DOCUMENTS

| | | | |
|---|---|---|---|
| 4,099,091 | 7/1978 | Yanazoe et al. | 313/509 |
| 4,880,475 | 11/1989 | Lindmayer | 427/69 |
| 5,128,587 | 7/1992 | Skotheim et al. | 313/504 |
| 5,200,668 | 4/1993 | Ohashi et al. | 313/498 |
| 5,225,273 | 7/1993 | Mikoshiba et al. | 428/323 |
| 5,476,727 | 12/1995 | Maruta | 428/690 |
| 5,589,733 | 12/1996 | Noda et al. | 313/509 |
| 5,640,067 | 6/1997 | Yamauchi et al. | 313/504 |
| 5,660,697 | 8/1997 | Kawashima et al. | 204/192.22 |
| 5,710,484 | 1/1998 | Iwanaga et al. | 313/504 |
| 5,773,929 | 6/1998 | Shi et al. | 313/504 |
| 5,783,292 | 7/1998 | Tokito et al. | 428/212 |

FOREIGN PATENT DOCUMENTS

| | | |
|---|---|---|
| 2-139893 | 5/1990 | Japan . |
| 2-196475 | 8/1990 | Japan . |
| 2-207488 | 8/1990 | Japan . |
| 5-41285 | 2/1993 | Japan . |

OTHER PUBLICATIONS

JSAP Catalog No.: AP 961105–03; Extended Abstracts (the 43$^{rd}$ Spring Meeting 1996); *The Japan Society of Applied Physics and Related Societies*, No. 3.

*Primary Examiner*—Charles Nold
*Attorney, Agent, or Firm*—Oblon, Spivak, McClelland, Maier & Neustadt, P.C.

[57] ABSTRACT

An organic EL device of the invention includes an inorganic material layer with a resistivity of less than 20 Ω-cm disposed between an electrode and a light emitting layer. The inorganic material layer contains at least one of indium oxide, tin oxide, and zinc oxide as a primary component, which is the same material as an anode, and at least one of silicon and germanium as an auxiliary component. This improves physical properties at the electrode-organic layer interface and restrains generation of dark spots, establishing an organic EL device featuring a long life, high efficiency and low cost.

17 Claims, 2 Drawing Sheets

ORGANIC EL DEVICE

BACKGROUND OF THE INVENTION

1. Field of the Invention

This invention relates to an organic electroluminescent device (to be referred to as organic EL device, hereinafter) using organic compounds and more particularly, to an organic EL device having a modified electrode-organic layer interface.

2. Background Art

Recently, active research works have been made on organic EL light emitting devices. As a basic configuration, the device is constructed by using a transparent electrode of tin-doped indium oxide (ITO) as an anode, forming a hole transporting material such as triphenyldiamine (TPD) thereon by vacuum evaporation, depositing a fluorescent material such as an aluminum quinolinol complex (Alq3) as a light emitting layer, and forming an electrode (cathode) from a metal having a low work function such as magnesium. Attempts have been made to enhance the efficiency of hole injection by successively providing a plurality of organic layers such as a hole injecting layer, hole injecting and transporting layer, and hole transporting layer between the electrodes and the light emitting layer in accordance with the level of electron affinity or ionization potential in order to increase the luminous efficacy. These organic EL devices are attractive in that they can achieve a very high luminance ranging from 100 to 10,000 cd/m$^2$ with a drive voltage of approximately 10 volts.

The anode for supplying holes to the light emitting layer is formed of transparent conductive materials such as tin-doped indium oxide (ITO) because of the conventional construction that emitted light emanates on the anode side. A hole transporting layer, a hole transporting and light emitting layer, a light emitting layer or the like is deposited adjacent to the anode.

However, problems arise if the anode is disposed in direct contact with an organic material layer such as a layer of hole transporting material such as triphenyldiamine (TPD), a light emitting layer of aluminum quinolinol complex (Alq3) and a hole injecting layer. The adhesion between the anode and the organic material layer and the efficiency of hole injection are exacerbated. Interfacial separation can occur to form non-light-emissive areas known as dark spots. The reduction of hole injection efficiency can deteriorate the performance of the organic EL device.

DISCLOSURE OF THE INVENTION

An object of the present invention is to provide an organic EL device having improved physical properties at the electrode-organic layer interface which restrains generation of dark spots and features a long lifetime, high efficiency and low cost.

In the attempt to improve the physical properties of an organic layer at the electrode-organic layer interface, the inventors found, that the performance of an organic EL device is significantly improved by forming a layer of an inorganic material having a resistivity of less than 20 Ω-cm between the electrode and the organic layer. At first, we understood that this performance improvement is achieved because the inorganic material layer functions as a hole injecting layer due to its semiconductive properties. Through the ensuing research, however, we have found that the inorganic material layer is rather more effective in tailoring mainly the electrode interface and improving the physical properties of the organic layer at its interface for thereby improving the adhesion therebetween. The present invention is predicated on this finding.

It is noted that Japanese Patent Application Kokai (JP-A) Nos. 139893/1990, 196475/1990, and 207488/1990 disclose that using single semiconductors such as C, Ge, Si, and Sn, binary IV-IV Group semiconductors such as SiC, III-V Group semiconductors such as AlSb, BN, BP, GaN, GaSb, GaAs, GaP, InSb, InAs, and InP, and II-VI Group semiconductors such as CdS, CdSe, CdTe, ZnO, and ZnS, a semiconductor thin-film layer is deposited together with an organic compound thinfilm layer between two electrodes. The layers described in these publications, however, are semiconductor thin-film layers substituting for the organic material and cannot improve the physical properties at the interface between the anode of ITO, etc. and the organic layer. No reference is made to resistivity and the use of electrode material and additives.

Also JP-A 41285/1993 discloses to use n- or p-type inorganic oxide semiconductor materials such as NiO as the hole transporting material. These semiconductor materials, however, have disadvantages including a high resistivity, low luminous efficiency, and high drive voltage when NiO is used alone, for example. No reference is made to the need to improve the physical properties of a film interface, resistivity and the use of electrode material and additives.

Specifically stated, the object of the invention is achieved by the following constructions (1) through (8).

(1) An organic electroluminescent device comprising an inorganic material layer disposed between an electrode and a light emitting layer and having a resistivity of up to 20 Ω-cm.

(2) The organic electroluminescent device of (1) wherein said inorganic material layer contains at least one member selected from the group consisting of indium oxide, tin oxide, and zinc oxide as a primary component.

(3) The organic electroluminescent device of (2) wherein said inorganic material layer contains at least one of silicon and germanium as an auxiliary component in addition to the primary component.

(4) The organic electroluminescent device of (3) wherein said auxiliary component further contains at least one element selected from the group consisting of boron, phosphorus, carbon, nitrogen, and oxygen.

(5) The organic electroluminescent device of (2) wherein said inorganic material layer contains at least one member selected from the group consisting of nickel, titanium, zirconium, niobium, tantalum, and strontium oxides as an auxiliary component in addition to the primary component.

(6) The organic electroluminescent device of (1) wherein said inorganic material layer contains at least one member selected from the group consisting of nickel, titanium, zirconium, niobium, tantalum, and strontium oxides as a primary component.

(7) The organic electroluminescent device of (6) wherein said inorganic material layer further contains at least one element selected from the group consisting of boron, phosphorus, carbon, and nitrogen as an auxiliary component.

(8) The organic electroluminescent device of (2) wherein the primary component of said inorganic material layer contains the same material as an anode.

FUNCTION AND RESULTS

According to the present invention, an organic EL device which has improved physical properties at the electrode-organic layer interface, restrains generation of dark spots, features a long lifetime and high efficiency, and can eliminate a hole injecting layer or the like can be established at a low cost.

DESCRIPTION OF THE PREFERRED EMBODIMENTS

The organic EL device of the invention has an inorganic material layer with a resistivity of less than 20 Ω-cm disposed between an electrode and a light emitting layer. The interposition of the inorganic material layer between an anode and an organic layer improves the physical properties at the anode-organic layer interface, thereby establishing the anode having improved adhesion and hole injection efficiency.

The inorganic material layer should have a resistivity of 20 Ω-cm or less. A lower resistivity is recommended, and a resistivity in the range of $1 \times 10^{-1}$ to 5 Ω-cm is preferable. A resistivity in excess of 20 Ω-cm requires a higher drive voltage and an increased power consumption, invites a lowering of luminance due to reduced current, and brings the risk of breakdown.

Preferably the inorganic material layer contains at least one of indium oxide, tin oxide, and zinc oxide as a primary component. Any of these oxides may be contained in any desired ratio. It is preferred for the inorganic material layer to contain indium oxide in admixture with tin oxide and/or zinc oxide. In this embodiment, tin oxide and/or zinc oxide is preferably contained in amounts of 1 to 50 at % of the entirety calculated as Sn and Zn. The more preferred range is 1 to 20 at % of Sn and 1 to 30 at % of Zn, especially 5 to 10 at % of Sn and 5 to 20 at % of Zn.

Usually the primary component of the inorganic material layer is the same material as the anode although the primary component may be either identical with or different from the anode in practice. Preferably the primary component of the inorganic material layer is one component of the anode, especially the main component of the anode or a material with a composition deviating from the anode by approximately 20%.

Figure 3:
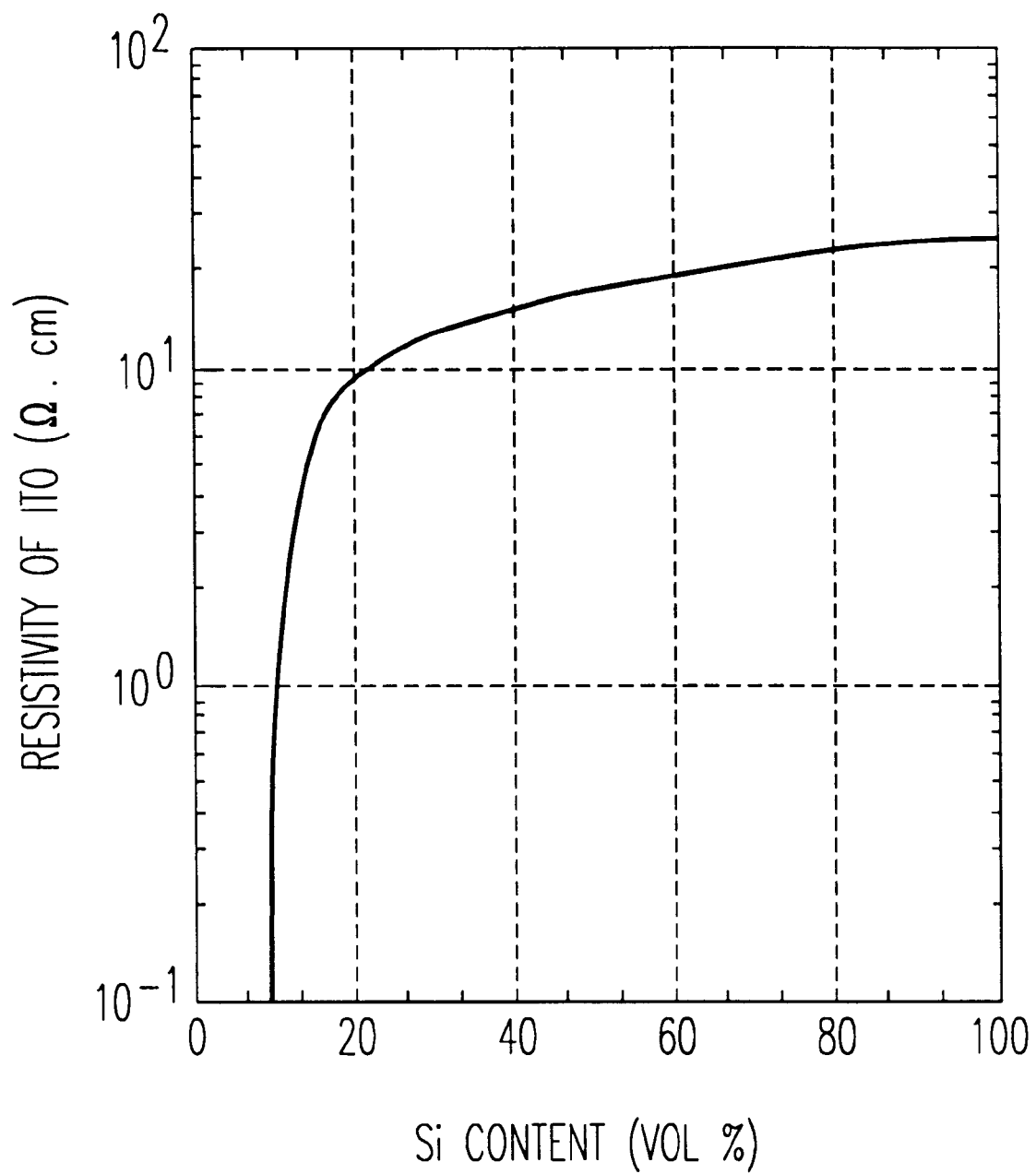
FIG. 3 is a graph showing the resistivity of ITO relative to Si added thereto.

In addition to the primary component, the inorganic material layer preferably contains at least one of silicon and germanium as an auxiliary component. The addition of the auxiliary components of silicon and germanium can improve the physical properties at the interface between the electrode and the organic layer, thereby preventing dark spot generation and leakage. FIG. 3 shows the resistivity of ITO (Sn: 10 wt %) relative to a silicon (Si) content thereof. As is evident from the graph, the resistivity is 20 Ω-cm at a silicon content of 60 vol % and decreases to less than about 10 Ω-cm at silicon contents of less than 20 vol %, showing a marked decline. Either of silicon and germanium may be used. When used in admixture, they may be blended in any desired ratio. For example, an inorganic material layer containing silicon and/or germanium in addition to the primary component can be formed by furnishing a composite target having silicon and germanium mixed in a total amount of 0.01 to 20 wt %.

The amount of the auxiliary component added is preferably less than 15 at %, more preferably 0.5 to 15 at %, especially 1.0 to 15 at % based on the primary component.

Instead of silicon and germanium, nickel oxide may also be used as the auxiliary component. Although the use of nickel oxide alone gives a higher resistivity and requires a greater drive voltage, the addition of nickel oxide to the primary component is effective for lowering resistivity and stabilizing film quality. The nickel oxide used herein should have a composition deviating within the range of ±10% from the stoichiometric composition NiO. The amount of nickel oxide added is preferably in the range of 5 to 50 at % of Ni, more preferably 5 to 30 at % of Ni based on the primary component.

Where silicon and germanium are used as the auxiliary component, at Least one element of boron, phosphorus, carbon, nitrogen, and oxygen may be contained in addition to the silicon and germanium. Resistivity can be further reduced by using a Group 3 element such as boron or a Group 5 element such as phosphorus in addition to silicon and germanium. Film quality can be stabilized by adding carbon, nitrogen and oxygen. The amount of boron and phosphorus added to silicon and germanium is preferably less than 10 at % of the entire auxiliary components. Also, carbon, nitrogen and oxygen may be added at the most in such amounts as to provide the stoichiometric composition of carbides, nitrides and oxides of silicon and germanium formed as a result of their addition, that is, the atomic ratio of $Si(Ge)_3C$, $Si(Ge)_3N_4$, and $Si(Ge)_3O_2$. Preferably the amount of carbon, nitrogen and oxygen is less than 10 at % based on silicon and germanium. The minimum content of boron, phosphorus, carbon, nitrogen and oxygen is about 0.1 at %. Among these elements, carbon, nitrogen and oxygen may be added as by reactive sputtering and boron, phosphorus, carbon, nitrogen and oxygen may be contained in the target.

Nickel oxide may be used as the primary component instead of the indium oxide, tin oxide, and zinc oxide. The nickel oxide used herein may have a composition deviating within the range of +10% from the stoichiometric composition NiO.

In the embodiment wherein nickel oxide is used as the primary component, at least one element of boron, phosphorus, carbon, and nitrogen is preferably contained as added in the previous embodiment as the auxiliary component. The inclusion of these additives is effective for lowering resistivity (mainly in the case of boron and phosphorus) or stabilizing film quality (carbon, nitrogen and oxygen). The amount (in at %) of boron, phosphorus, carbon and nitrogen as expressed relative to nickel in the nickel oxide is the same as the aforementioned amount relative to silicon and germanium. It is noted that the upper limit of carbon and nitrogen is preferably 10 at %. A resistivity of less than 20 Ω-cm can be established by blending these additives in the primary component according to the invention although NiO which is a p-type inorganic oxide semiconductor has a high resistivity and requires a greater drive voltage when used alone as the hole transporting layer as described in JP-A 41285/1993.

Instead of or in admixture with the nickel oxide used as the primary component or auxiliary component, at least one oxide of titanium, zirconium, niobium, tantalum, and strontium may be used. Where two or more oxides are used, they may be blended in any desired ratio. Where these compounds are used or mixed, sputtering may be done on a target with chips of the compounds rested thereon. These oxides may have an oxygen content deviating within about ±10% from their stoichiometric composition TiO, $ZrO_2$, $Nb_2O_3$, $Ta_2O_3$ and SrO.

Although the inorganic material layer can be formed by evaporation or the like, it is preferably formed by sputtering, especially DC sputtering. The power supply to the DC sputtering apparatus is preferably in the range of 0.1 to 4 $W/cm^2$, especially 0.5 to 1 $W/cm^2$.

The sputtering gas is not critical and inert gases such as Ar, He, Ne, Kr and Xe and mixtures thereof may be used. Upon sputtering. the sputtering gas is generally under a pressure of about 0.1 to 20 Pa.

The thickness of the inorganic material layer should be equal to or more than the level ensuring a resistivity of less than 20 Ω-cm and film quality improvement, preferably 0.5 to 30 nm, more preferably 3 to 20 nm, especially about 10 nm.

In the embodiment wherein an oxide, nitride or carbide of silicon, germanium or the like is added to the inorganic material layer, the inorganic material layer may be formed by reactive sputtering. The reactive sputtering method facilitates film formation subsequent to the anode formation. The target used herein is the same material as the anode, but doped with silicon, germanium or the like while the reactive gas includes $O_2$ and $CO_2$ for the formation of oxides, $N_2$, $NH_3$, NO, $NO_2$ and $N_2O$ for the formation of nitrides, and $CH_4$, $C_2H_2$, and $C_2H_4$ for the formation of carbides. These reactive gases may be used alone or in admixture of two or more.

A DC sputtering apparatus is the preferred sputtering apparatus. The power supply thereto is preferably in the range of 0.1 to 4 $W/cm^2$, especially 0.5 to 1 $W/cm^2$. The sputtering gas for reactive sputtering is not critical and inert gases such as Ar, He, Ne, Kr and Xe and mixtures thereof may be used. Upon sputtering, the sputtering gas and reactive gas may be fed at a flow rate of about 1 to 10 sccm.

After deposition, the inorganic material layers may be subjected to heat treatment at about 150 to 300° C. for about 1 to 3 hours for reducing the resistivity.

The organic light emitting device of the present invention is either of the construction including an anode on a substrate and a cathode above the anode and the construction including a cathode on a substrate and an anode above the cathode, known as the inverted layer arrangement. The device includes at least inorganic material layer and at least one light emitting layer interposed between these electrodes and further includes a protective layer as the uppermost layer. The device may further include a hole transporting layer and an electron injecting and transporting layer, if necessary, although these layers can be omitted.

The cathode is preferably constructed of a metal or alloy having a low work function which can be deposited by sputtering or the like. With respect to the material of which the cathode is constructed, it is preferred to use metal elements such as K, Li, Na, Mg, La, Ce, Ca, Sr, Ba, Al, Ag, In, Sn, Zn and Zr as the low work function material for effectively carrying out electron injection or binary and ternary alloys containing such elements for improving the stability. The preferred alloys are Mg-Ag (Ag 1 to 20 at %), Mg-In (In 1 to 50 at %), Al-Ca (Ca 1 to 20 at %), and Al-In (In 1 to 10 at %), for example. Accordingly, such cathode-forming metals and alloys are generally used as the sputtering target. The anode is constructed by depositing a film of indium-tin oxide (ITO), indium-zinc oxide (IZO), ZnO, $SnO_2$, and $In_2O3$ by a sputtering technique.

Figure 1:
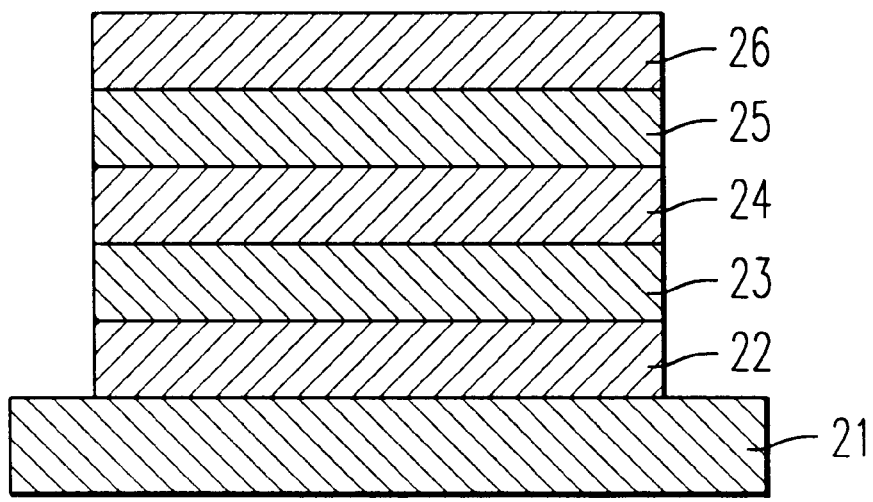
FIG. 1 is a schematic view of one exemplary structure of the organic EL device.
Figure 2:
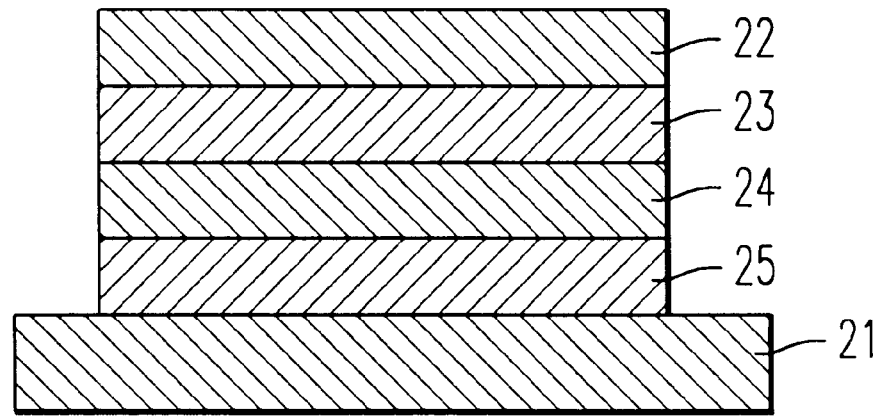
FIG. 2 is a schematic view of another exemplary structure (inverted layer arrangement) of the organic EL device.

Exemplary structures of the organic light emitting device fabricated according to the present invention is shown in FIGS. 1 and 2. The EL device shown in FIG. 1 includes on a substrate 21, an anode 22, an inorganic material layer 23, a light emitting and electron injecting/transporting layer 24, a cathode 25, and a protective layer 26 stacked in the described order. The EL device shown in FIG. 2 is of the inverted layer arrangement from that of FIG. 1 and includes on a substrate 21, a cathode 25, a light emitting and electron injecting/transporting layer 24, an inorganic material layer 23, and an anode 22 stacked in the described order.

The organic EL device of the invention is not limited to the illustrated embodiments and may be of various other arrangements, for example, an arrangement including a light emitting layer deposited for the sole purpose and an electron injecting and transporting layer disposed between the light emitting layer and the metal electrode. If necessary, a hole injecting and transporting layer may be provided or it may be combined with a light emitting layer.

If necessary, the cathode, anode and organic layers such as light emitting layer can be patterned by such techniques as mask evaporation and etching after film deposition, thereby obtaining a desired light emitting pattern. It is further possible to use a thin film transistor (TFT) as the substrate and form the respective layers in accordance with the pattern of TFT, the resulting pattern being ready for use as a display and drive pattern.

After the completion of the electrode, the abovementioned protective film and/or another protective layer using metallic materials such as Al, inorganic materials such as SiOx and organic materials such as Teflon may be formed. The protective film may be either transparent or opaque where the light emission exits from the substrate 1 side. In the case of the inverted layer arrangement, the protective film must be transparent. To acquire transparency, a transparent material (e.g., $SiO_2$) is selectively used or a thickness is controlled to be transparent (preferably a transmittance of the light emission of more than 80%). In general, the protective film is about 50 to 1,200 nm thick. The protective film may be formed by sputtering, evaporating and similar techniques.

It is noted that in the manufacture of organic EL devices, if patterning is carried out subsequent to the completion of the cathode, the cathode is oxidized at the surface because it is once taken out in the air. Such an oxide layer can cause a reduction of electron injection efficiency and the generation of dark spots. It is thus preferable to establish a vacuum again and carry out back sputtering (to sputter the cathode surface) to remove the oxide layer. The oxide layer can be removed by sputtering the cathode surface typically to a depth of about 2 to 3 nm through back sputtering.

It is further favorable to form a sealing layer on the device in order to prevent oxidation of the organic layers and electrodes of the device. As the sealing layer, sealing plates such as glass plates are bonded and sealed using adhesive resin layers such as commercially available low hygroscopic photo-curable adhesives, epoxy adhesives, silicone adhesives, and crosslinkable ethylene-vinyl acetate copolymer adhesive sheets for preventing entry of moisture. Metal and plastic plates can be used instead of the glass plates.

Next, the organic material layers included in the EL device of the invention is described.

The light emitting layer has functions of injecting holes and electrons, transporting them, and recombining holes and electrons to create excitons. It is preferred that relatively electronically neutral compounds be used in the light emitting layer.

The hole injecting and transporting layer, which is included if necessary, has functions of facilitating injection of holes from the anode, transporting holes in a stable manner, and obstructing electron transportation. The electron injecting and transporting layer has functions of facilitating injection of electrons from the cathode, transporting electrons in a stable manner, and obstructing hole transportation. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually preferred to be about 5 to 500 nm, especially about 10 to 300 nm.

The thickness of the hole injecting and transporting layer and the electron injecting and transporting layer is equal to or range from 1/10 to 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 20 nm thick. The upper limit of thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound having a light emitting capability. The fluorescent material may be at least one member selected from compounds as disclosed in JP-A 264692/1988, for example, quinacridone, rubrene, and styryl dyes. Also included are quinoline derivatives, for example, metal complex dyes having 8-quinolinol or a derivative thereof as a ligand such as tris(8-quinolinolato)aluminum, tetraphenyl-butadiene, anthracene, perylene, coronene, and 12-phthaloperinone derivatives. Further included are phenylanthracene derivatives of Japanese Patent Application No. 110569/1994 and tetraarylethene derivatives of Japanese Patent Application No. 114456/1994.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, enabling light emission shifted to a longer wavelength and improving the luminous efficacy and stability of the device.

Preferred host materials are quinolinolato complexes, more preferably aluminum complexes having 8-quinolinol or a derivative thereof as a ligand. Examples of the aluminum complex are disclosed in JP-A 264692/1988, 255190/1991, 70733/1993, 258859/1993, and 215874/1994.

Illustrative examples include tris(8-quinolinolato)-aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof.

Examples include bis(2-methyl-8-quinolinolato) (phenolato)-aluminum(III), bis(2-methyl-8-quinolinolato) (orthocresolato)aluminum(III), bis(2-methyl-8-quinolinolato)(metacresolato)aluminum(III), bis(2-methyl-8-quinolinolato)(paracresolato)alumiinum(III), bis(2-methyl-8-quinolinolato)(ortho-phenylphenolato)aluminum (III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminuim (III), bis(2-methyl-8-quinolinolato)(3,4-dimethylphenolato) aluminum(III), bis(2-methyl-8-quinolinolato)(3,5-dimethylphenolato)aluminum(III), bis(2-methyl-8-quinolinolato)(3,5-di-tert-butylphenolato) aluminum(III), bis(2-methyl-8-quinolinolato)(2,6-diphenylphenolato) alumirium(III), bis(2-methyl-8-quinolinolato)(2,4,6-triphenyphenolato)aluminum(III), bis(2-methyl-8-quinolinolato) (2,3,6-trimethylphenolato)aluminum(III), bis (2-methyl-8-cluinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(orthophenylphenolato)aluminum(III), bis(2, 4-dimethyl-8-quinolinolato)(para-phenylphenolato) aluminum(III), bis(2,4-dimethyl-8-quinolinolato)(meta-phenylphenolato)-aluminum(III), bis(2,4-dimethyl-8-quinolinolato)(3,5-dimethylphenolato)aluminum(III), bis(2, 4-dimethyl-8-quinolinolato) (3,5-di-tert-butylphenolato) aluminum(III), bis(2-methyl-4-ethyl-8-quinolinolato)(para-cresolato)-aluminum(III), bis(2-methyl-4-methoxy-8-quinolinolato)(paraphenylphenolato)aluminum(III), bis(2-methyl-5-cyano-8-quinolinolato)((ortho-cresolato) aluminum(III), and bis(2-methyl-6-trifluoromethyl-8-quinolinolato)(2-naphtholato)-aluminum(III).

Also acceptable are bis(2-methyl-8-quinolinolato)-aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum (III), bis(2-methy-4-methoxyquinolinolato)aluminum(III)-$\mu$-oxo-bis(2-methyl-4-methoxyquinolinolato)aluminum (III), bis (5-cyano-2-methyl-8-quinolinolato)aluminum (III)-$\mu$-oxo-bis(5-cyano-2-methyl-8-quinolinolato)aluminum (III), and bis(2-methyl-5-trifluoromethyl-8-quinolinolato)aluminum (III)-$\mu$-oxo-bis(2-methyl-5-trifluoromethyl-8-quinolinolato) aluminum (III).

Other useful host materials are phenylanthracene derivatives as described in Japanese Patent Application No. 110569/1994 and tetraarylethene derivatives as described in Japanese Patent Application No. 114456/1994.

The light emitting layer can also serve as an electron injecting and transporting layer. In this case, it is preferred to use tris(8-quinolinolato)aluminum etc. These fluorescent materials can be evaporated.

As the case may be, it is preferred that the light emitting layer be a layer of a mixture of at least one hole injecting and transporting compound and at least one electron injecting and transporting compound, in which the dopant is desirably contained. In such a mix layer, the content of the compound is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited. The organic compound is less susceptible to damage, resulting in the advantage of an extended device life. By incorporating the above-mentioned dopant in such a mix layer, the light emission wavelength the mix layer itself possesses can be altered, enabling light emission shifted to a longer wavelength and improving the luminous intensity and stability of the device.

The hole injecting and transporting compound and the electron injecting and transporting compound used in the mix layer may be selected from compounds for the hole injecting and transporting layer and compounds for the electron injecting and transporting layer to be described later, respectively. Inter alia, the compounds used for the hole injecting and transporting layer are preferably amine derivatives having intense fluorescence, for example, triphenyldiamine derivatives which are hole transporting materials as well as styrylamine derivatives and amine derivatives having an aromatic fused ring.

The compounds used for the electron injecting and transporting layer are preferably quinoline derivatives and metal complexes having 8-quinolinol or a derivative thereof as a ligand, especially tris(8-quinolinolato)aluminum (Alq3). It is also preferred to use the above-mentioned phenylanthracene derivatives and tetraarylethene derivatives.

The compounds used for the hole injecting and transporting layer are preferably amine derivatives having intense fluorescence, for example, triphenyldiamine derivatives which are hole transporting materials as well as styrylamine derivatives and amine derivatives having an aromatic fused ring.

In this regard, the mix ratio is determined by taking into account carrier mobility and a carrier concentration. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

The thickness of the mix layer preferably ranges from the thickness corresponding to a single molecular layer to less than the thickness of an organic compound layer, for example, preferably from 1 to 85 nm, more preferably 5 to 60 nm, most preferably 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

For the hole injecting and transporting layer, there may be used various organic compounds as described in JP-A 295695/1988, 191694/1990, 000792/1991, 234681/1993, 239455/1993, 299174/1993, 126225/1995, 126226/1995, and 100172/1996 and EP 0650955A1. Examples are tetraarylbenzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. These compounds may be used in a combination of two or more and for the combined used, they may be stacked as separate layers or mixed.

Where the hole injecting and transporting layer is formed as comprising a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the anode (ITO etc.). It is also preferred to use a compound having good thin film forming ability at the anode surface. The order of lamination also applies where a plurality of hole injecting and transporting layers are provided. Such an order of lamination is effective for lowering drive voltage and preventing current leakage and development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer and the like, the hole injecting and transporting layer can be formed by evaporating the above-mentioned compounds.

For the electron injecting and transporting layer which is provided if necessary, there may be used quinoline derivatives including organic metal complexes having 8-quinolinol or a derivative thereof as a ligand such as tris(8-quinolinolato)aluminum (Alq3), oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as a light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed as comprising an electron injecting layer and an electron transporting layer, two or more compounds are selected in a proper combination from the compounds commonly used in electron injecting and transporting layers. In this regard, it is preferred to laminate layers in such an order that a layer of a compound having a greater electron affinity may be disposed adjacent the cathode. This order of lamination also applies where a plurality of electron injecting and transporting layers are provided.

As to the substrate material, transparent or translucent materials such as glass, quartz and resins are used in the embodiment wherein light emission exits from the substrate side. The substrate may be provided with a color filter film, fluorescent material-containing color conversion film. or dielectric reflecting film for controlling the color of light emission. In the inverted layer arrangement, the substrate may be either transparent or opaque. Ceramics may be used where the substrate is opaque.

The color filter film may be selected from color filters as used in liquid crystal displays. The properties of a color filter may be adjusted in accordance with the light emitted by the organic EL device so as to optimize the output efficiency and color purity.

Also, if the color filter used is capable of cutting off the extraneous light of short wavelength that the EL device material and fluorescent conversion layer can absorb, the device is improved in light resistance and display contrast.

Also optical thin films such as dielectric multilayer films may be used instead of the color filter.

The fluorescent conversion filter film is to convert the color of light emission by absorbing the light of electroluminescent emission and instead, allowing the fluorescent material in the fluorescent conversion film to emanate light. The film has a composition comprising a binder, a fluorescent material and a light-absorbing material.

The fluorescent material used herein is basically one having a high fluorescent quantum efficiency and desirably exhibiting strong absorption in the EL emission wavelength region. Laser dyes are adequate in practice. There may be used rhodamine compounds, perylene compounds, cyanine compounds, phtialocyanine compounds (inclusive of subphthalo compounds), naphthalimide compounds, fused ring hydrocarbon compounds, fused heterocycle compounds, styryl compounds and cumarin compounds.

For the binder, a choice may be made among those materials which do not essentially quench fluorescence and preferably which can be finely patterned by photolithography and printing techniques. Also preferred are those materials which are not damaged during deposition of ITO.

The light absorbing material is used when the fluorescent material is short of light absorption. It may be omitted if unnecessary. The light absorbing material is selected from those materials which do not quench the fluorescence of fluorescent materials.

For the formation of the hole injecting and transporting layer, the light emitting layer and the electron injecting and transporting layer, a vacuum evaporation teclhnique is preferably employed because homogeneous thin films can be formed. The use of the vacuum evaporation tecdnique enables formation of homogeneous thin films in amorphous state or having a grain size of less than 0.1 $\mu$m. A grain size of more than 0.1 $\mu$m would cause uneven light emission and a significant drop of charge injection efficiency and requires a higher voltage to drive the device.

The conditions for vacuum evaporation are not critical although a vacuum of lower than $10^{-5}$ Torr and an evaporation rate of about 0.01 to 1 nm/sec. are preferred. It is also preferred to successively form the respective layers in vacuum. The successive formation of layers in vacuum prevents the interface of every layer from adsorbing impurities and affords better properties. Additionally, the drive voltage of the device can be reduced and the generation and growth of dark spots can be suppressed.

In the embodiment wherein the vacuum evaporation technique is used to form the respective layers, when a plurality of compounds are to be contained in one layer, it is preferred that boats containing the respective materials be independently temperature controlled to achieve codeposition.

The organic EL device of the invention is generally of the DC drive type while it can be of the AC or pulse drive type. The applied voltage is generally about 2 to 20 volts.

EXAMPLE

Examples of the present invention are given below by way of illustration.

Example 1

ITO (indium oxide-tin SnO 10 wt %) of 200 nm thick was formed on a glass substrate as a transparent electrode by sputtering, patterned, and subjected to ultrasonic washing with neutral detergent, acetone, and ethanol. The substrate was pulled up from boiling ethanol and dried. The transparent electrode on its surface was cleaned with UV/$O_3$. The substrate was secured by a holder in a vacuum evaporation chamber, which was evacuated to a vacuum of lower than $1 \times 10^{-4}$ Pa.

With the vacuum kept, an inorganic material layer of 10 nm thick was deposited on the ITO electrode by magnetron sputtering using a target consisting of ITO as a primary component and 10 vol % of silicon mixed as an auxiliary component. The inorganic material layer as deposited had a composition of 95 at % In and 5 at % Si and a resistivity of less than 20 $\Omega$-cm. Note that the resistivity was determined by depositing an inorganic material layer on an insulating substrate under the same conditions and measuring the sheet resistance of the layer. Thereafter, the inorganic material layer was heat treated in a $N_2$ atmosphere at 100 to 300° C. for 2 hours for reducing the resistivity.

With the vacuum kept, the inorganic material-bearing substrate was transferred to an evaporation chamber where tris(8-quinolinolato)aluminum (Alq3) was evaporated under a vacuum of $1 \times 10^{-4}$ Pa at a deposition rate of 0.2 nm/sec. to a thickness of 110 nm to form an electron injecting/transporting and light emitting layer.

Next, on the substrate having the organic EL arrangement deposited thereon, a Mg-Ag alloy (weight ratio 10:1) was co-evaporated under a vacuum of $1 \times 10^{-4}$ Pa at a deposition rate of 0.2 nm/sec. to a thickness of 200 nm to form a cathode.

A DC voltage was applied across the resulting organic EL device in a dry argon atmosphere to continuously drive the device at a constant current density of 10 mA/cm$^2$. At the initial, the device was found to emit green light with 500 cd/m$^2$ at 8 volts (light emission maximum wavelength $\lambda$max=520 nm). The half-life of luminance was 500 hours, with a drive voltage increase of 2 volts. After 2,000 hours of driving, formation of dark spots with a diameter of more than 0.1 mm was not found at all.

Example 2

Organic EL devices were fabricated as in Example 1 except that indium-zinc oxide (IZO, ZnO 8 wt %), ZnO, $SnO_2$, and $In_2O_3$ were used instead of the ITO as the primary component and germanium was used instead of the silicon as the auxiliary component. The results were substantially equivalent to those of Example 1.

Example 3

An organic EL device was fabricated as in Example 1 except that a target having 1 wt % of boron mixed in addition to silicon was used as the target for the inorganic material layer.

The organic EL device thus fabricated was examined as in Example 1, obtaining substantially equivalent results.

Example 4

An organic EL device was fabricated as in Example 3 except that phosphorus was used instead of the boron, obtaining similar results to Example 3.

Example 5

An organic EL device was fabricated as in Example 3 except that a reactive sputtering apparatus was used as the sputtering apparatus and $N_2$ gas was mixed with argon so as to give a mix ratio of 5 vol %, obtaining similar results to Example 3.

Example 6

Organic EL devices were fabricated as in Example 5 except that instead of the $N_2$ gas, $O_2$ gas and $CO_2$ gas were respectively used so as to give a mix ratio of 1 vol %, obtaining similar results to Example 5.

Example 7

ITO (indium oxide-tin SnO 10 wt %) of 200 nm thick was formed on a glass substrate as a transparent electrode by sputtering, patterned, and subjected to ultrasonic washing with neutral detergent, acetone, and ethanol. The substrate was pulled up from boiling ethanol and dried. The transparent electrode on its surface was cleaned with UV/$O_3$. The substrate was secured by a holder in a vacuum evaporation chamber, which was evacuated to a vacuum of lower than $1\times10^{-4}$ Pa.

With the vacuum kept, an inorganic material layer of 10 nm thick was deposited on the ITO electrode by magnetron sputtering using a target consisting of $In_2O_3$ as a primary component and NiO in an amount of 30 vol % of the $In_2O_3$ mixed as a primary auxiliary component. The inorganic material layer as deposited had a composition of 85 at % In and 15 at % Ni and a resistivity of less than 20 Ω-cm. Thereafter, for surface treatment or cleaning, the inorganic material-bearing substrate was allowed to stand at room temperature for 2 hours in an ozone gas atmosphere which was established by burning a UV lamp in an $O_2$ atmosphere, whereby the surface was oxidized.

The inorganic material-bearing substrate was transferred to an evaporation chamber where tris(8-quinolinolato) aluminum (Alq3) was evaporated under a vacuum of $1\times10^{-4}$ Pa at a deposition rate of 0.2 nm/sec. to a thickness of 110 nm to form an electron injecting/transporting and light emitting layer.

Next, on the substrate having the organic EL arrangement deposited thereon, a Mg-Ag alloy (weight ratio 10:1) was co-evaporated under a vacuum of $1\times10^{-4}$ Pa at a deposition rate of 0.2 nm/sec. to a thickness of 200 nm to form a cathode.

A DC voltage was applied across the resulting organic EL device in a dry argon atmosphere to continuously drive the device at a constant current density of 10 mA/cm$^2$. At the initial, the device was found to emit green light with 500 cd/cm$^2$ at 8 volts (light emission maximum wavelength λmax=520 nm). The half-life of luminance was 500 hours, with a drive voltage increase of 2 volts. After 2,000 hours of driving, formation of dark spots with a diameter of more than 0.1 mm was not found at all. Similar results were obtained when oxides of Ti, Zr, Nb, Ta and Sr were individually used instead of Nio.

Example 8

An organic EL device was fabricated as in Example 7 except that a target having 8 vol % of boron mixed with the NiO was used to form an inorganic material layer of 10 nm thick.

The organic EL device thus fabricated was examined as in Example 7, obtaining similar results to Example 7. Equivalent results were obtained when inorganic material layers were formed by using phosphorus, carbon and nitrogen instead of the boron as the additive element. Similar results were also obtained when oxides of Ti, Zr, Nb, Ta and Sr were used instead of Nio.

We claim:

1. Art organic electroluminescent device comprising an inorganic material layer disposed between an anode and an organic light emitting layer and having a resistivity of up to 20 Ω-cm, wherein said inorganic material layer comprises only inorganic materials and is selected from the following compositions (1) and (2), wherein composition (1) is:

(A) at least one member selected from the group consisting of indium oxide, tin oxide, and zinc oxide, (B1) at least one of silicon and germanium in an amount of 0.01 to 20 wt. % of said inorganic material layer, or (B2) at least one member selected from the group consisting of oxides of a metal selected from the group consisting of nickel, titanium, zirconium, niobium, and strontium, in an amount of 5 to 50 at % of metal, based on component (A), and when component (B1) is present, optionally (C) at least one element selected from the group consisting of boron, phosphorous, carbon, nitrogen and oxygen in a total amount of about 0.1 to less than 10 at %, based on the amount of component (B1); and composition (2) is:

(A) at least one member selected from the group consisting of oxides of a metal selected from the group consisting of nickel, titanium, zirconium, niobium, tantalum, and strontium, and (B) at least one element selected from the group consisting of boron, phosphorous, carbon, and nitrogen, in an amount of 0.1 to 10 at % relative to the amount of metal of component (A).

2. The organic electroluminescent device of claim 1, wherein the inorganic material layer comprises composition (1).

3. The organic electroluminescent device of claim 2, wherein component (B1) is present.

4. The organic electroluminescent device of claim 3, wherein component (B1) and component (C) are present.

5. The organic electroluminescent device of claim 4, wherein component (C) is boron.

6. The organic electroluminescent device of claim 3, wherein component (B1) is Si.

7. The organic electroluminescent device of claim 3, wherein component (B1) is Ge.

8. The organic electroluminescent device of claim 4, wherein component (C) is phosphorous.

9. The organic electroluminescent device of claim 4, wherein component (C) is nitrogen.

10. The organic electroluminescent device of claim 4, wherein component (C) is oxygen.

11. The organic electroluminescent device of claim 2, wherein component (A) is ITO.

12. The organic electroluminescent device of claim 2, wherein component (A) is IZO.

13. The organic electroluminescent device of claim 2, wherein component (B2) is present.

14. The organic electroluminescent device of claim 13, wherein component (A) is $In_2O_3$ and component (B2) is NiO.

15. The organic electroluminescent device of claim 1, wherein the inorganic material layer comprises composition (2).

16. The organic electroluminescent device of claim 15, wherein component (A) is NiO and (B) is boron.

17. An organic electroluminescent device comprising an inorganic material layer disposed between an anode and an organic light emitting layer and having a resistivity of up to 20 Ω-cm, wherein said inorganic material layer comprises only inorganic materials and comprises:

(A) at least one member selected from the group consisting of indium oxide, tin oxide, and zinc oxide, and (B) at least one member selected from the group consisting of oxides of a metal selected from the group consisting of nickel, titanium, zirconium, niobium, tantalum and strontium, in an amount of 5 to 30 at % of metal, based on component (A).

* * * * *

UNITED STATES PATENT AND TRADEMARK OFFICE
CERTIFICATE OF CORRECTION

PATENT NO. : 5,981,092
DATED : November 9, 1999
INVENTOR(S) : Michio ARAI, et al.

It is certified that error appears in the above-indentified patent and that said Letters Patent is hereby corrected as shown below:

Column 13, line 60, "Art" should read --An--.

Signed and Sealed this

Sixth Day of March, 2001

Attest:

NICHOLAS P. GODICI

*Attesting Officer*    *Acting Director of the United States Patent and Trademark Office*